United States Patent [19]

Koyama

[11] Patent Number: 5,148,249
[45] Date of Patent: Sep. 15, 1992

[54] SEMICONDUCTOR PROTECTION DEVICE

[75] Inventor: Takeshi Koyama, Yokohama, Japan

[73] Assignee: Kabushiki Kaisha Toshiba, Kawasaki, Japan

[21] Appl. No.: 326,343

[22] Filed: Mar. 21, 1989

[30] Foreign Application Priority Data

Apr. 14, 1988 [JP] Japan .................................. 63-90213

[51] Int. Cl.$^5$ ..................... H01L 29/78; H01L 29/74
[52] U.S. Cl. ................... 357/23.13; 357/65; 357/20
[58] Field of Search .......................................... 357/41

[56] References Cited

U.S. PATENT DOCUMENTS

| 4,057,844 | 11/1977 | Smedley | 357/55 |
|---|---|---|---|
| 4,072,976 | 2/1978 | Havari | 357/51 |
| 4,342,045 | 7/1982 | Kim | 357/51 |
| 4,567,500 | 1/1986 | Avery | 357/86 |
| 4,730,208 | 3/1988 | Sugino et al. | 357/51 |
| 4,806,999 | 2/1989 | Strauss | 357/23.13 |
| 4,868,621 | 9/1989 | Miyamoto | 357/13 |

FOREIGN PATENT DOCUMENTS

| 56-50581 | 5/1981 | Japan . |
|---|---|---|
| 57-139957 | 8/1982 | Japan . |
| 57-154868 | 9/1982 | Japan . |
| 57-187962 | 11/1982 | Japan . |
| 74081 | 5/1983 | Japan . |
| 80973 | 5/1984 | Japan . |
| 59-106162 | 6/1984 | Japan . |
| 60-7763 | 1/1985 | Japan . |
| 60-234377 | 11/1985 | Japan . |
| 3507 | 1/1986 | Japan . |
| 19163 | 1/1986 | Japan . |
| 42170 | 2/1986 | Japan . |
| 61-228667 | 10/1986 | Japan . |
| 263253 | 11/1986 | Japan . |
| 263254 | 11/1986 | Japan . |
| 62-98675 | 5/1987 | Japan . |
| 63-175461 | 7/1988 | Japan . |
| WO89/04059 | 5/1989 | PCT Int'l Appl. . |
| 2187040 | 8/1987 | United Kingdom . |

OTHER PUBLICATIONS

English language translation of Japanese Patent 57-187962 to Yamada.
Patent Abstracts of Japan, vol. 10, No. 108 (E-398)(2165) Apr. 23, 1986 & JP-A-60 246668, Dec. 6, 1985.
Patent Abstracts of Japan, vol. 7, No. 4 (E-151)(1149) Jan. 8, 1983 & JP-A-57 164571, Oct. 9, 1982.
EPO Search Report, EP 89 10 6712, Sep. 3, 1990.

Primary Examiner—Andrew J. James
Assistant Examiner—Viet Q. Nguyen
Attorney, Agent, or Firm—Finnegan, Henderson, Farabow, Garrett and Dunner

[57] ABSTRACT

A semiconductor device constitutes a protection diode including a second region of first conductivity type beneath a marginal portion of an interconnection pad which is not utilized for bonding. The second region, together with an area of second conductivity type, constitutes the protection diode for protection against a possible negative surge voltage.

2 Claims, 4 Drawing Sheets

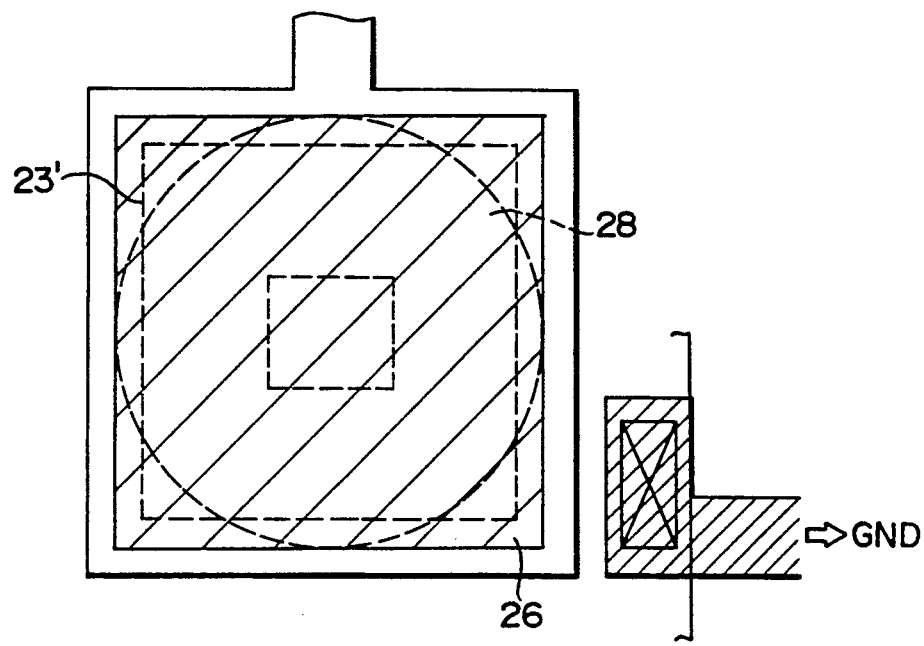
F I G. 4A
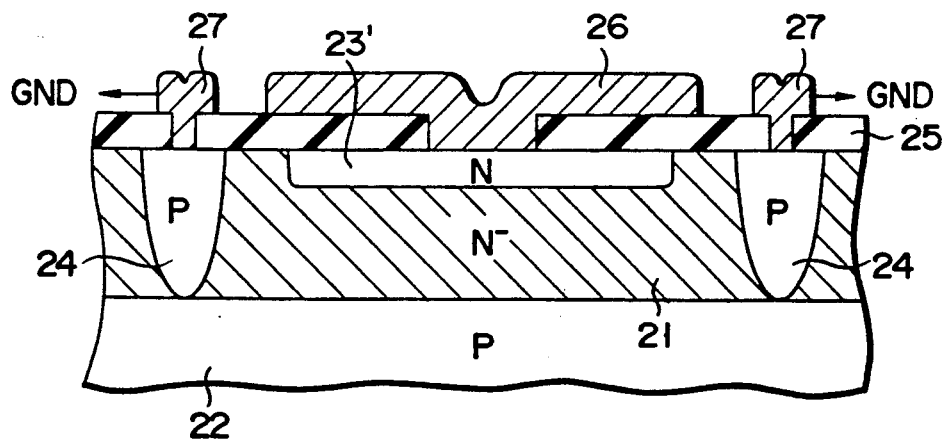
F I G. 4B

SEMICONDUCTOR PROTECTION DEVICE

BACKGROUND OF THE INVENTION

1. Field of the Invention

The present invention relates to a semiconductor device and, in particular, to a protection diode for protection against a possible negative surge voltage which is applied to a bonding pad.

2. Description of the Related Art

In a semiconductor device, such as an IC and LSI, a plurality of bonding pads 13 formed of, for example, aluminum are formed on the marginal area of a semiconductor chip 11 as shown in FIG. 1. The pads are connected to a semiconductor device area 12 by a wiring, such as an aluminum, and connected to lead terminals (not shown) by bonding wires (not shown) so that the semiconductor device area 12 is electrically connected to the lead terminals. A negative surge voltage protection diode 14 is formed between the pads 13 as shown in FIGS. 2A and 2B to allow a negative surge voltage which is induced from the lead terminal to be grounded. It is required that the diode has the surge withstand voltage of about −250 V. The aforementioned diode is manufactured as will be set forth below. A buried layer 15 of first conductive type (N type) having a high impurity concentration is formed, by thermal diffusion, in a protection diode formation area of the P type substrate 22. A first area 21 of N conductivity type lower in impurity concentration than the buried layer 15 is epitaxially grown on the substrate surface. An isolation layer 24 is thermally diffused around a pad formation area in the first area 21 and around a negative surge voltage protection diode 14 in the first area to achieve an element-to-element isolation in which case the isolation layer extends down to the substrate surface. When this is done, an island area and protection diode island area are formed beneath the pad. Then an N type diffusion region 16 and P type diffusion region 17 near to the diffusion region 16 are formed on the island area of a protection diode, serving as a cathode and anode, respectively. In this way, an insulating oxide film 25 is formed on the surface of the N type first area 21, isolation layer 24, N type diffusion region 16 and P type diffusion region 17. Of the oxide film 25, those portions overlying the N type diffusion layer 16 and P type diffusion layer 17 are etched to form a hole in the diffusion regions 16 and 17. Aluminum is evaporated over the pad formation area and over the respective diffusion layers to provide a pad 13 extending up to the N type diffusion region 16 as well as an electrode 18 connected to the P type diffusion layer 17.

In the semiconductor device thus manufactured, the protection diode 14 comprises the diffusion region 16 electrically connected to the pad 13 and diffusion region 17 connected to the electrode 18. Upon the generation of a negative surge current from the lead terminal to the pad 13, it flows into the N type diffusion region 16. Since the N type diffusion region and P type diffusion region provide a PN junction, the electric current flows into the P type diffusion region 17 and a potential is taken out of the pad via the electrode 18. Upon applying a surge voltage between, for example, the voltage 18 and a ground terminal no surge current flows across the semiconductor area 12, thus preventing a breakage of the semiconductor device.

In the aforementioned conventional semiconductor device, the diode area including the N type region 16 and P type region 17 has to be secured independently of the pad area because a withstand voltage of about −250 V is necessary. That is, an island area which is secured for the protection diode requires a third to a half of the island area underlying the pad 13, thus offering a bar to a reduction in a pad-to-pad distance and hence to an improvement in an integration density.

SUMMARY OF THE INVENTION

An object of the present invention is to provide a semiconductor device which can improve an integration density by forming a protection diode without providing any extra protection diode island area.

Another object of the present invention is to provide a semiconductor device which can be simplified in its structure by utilizing an element isolation layer as an area of second conductivity type for a protection diode.

According to the present invention there is provided a semiconductor device constituting a protection diode for protection against a negative surge voltage, comprising a first area of first conductivity type formed on a semiconductor substrate;

an interconnection pad formed with an insulating layer formed therebetween and having an effective bonding portion and noneffective bonding portion;

a second region of said first conductivity type formed substantially beneath the noneffective bonding portion of the pad and electrically connected to the pad, said second region having an impurity concentration higher than that of said first area;

an area of second conductivity type formed over the semiconductor substrate; and an electrode formed over said second conductivity type area via the insulating layer and electrically connected to the second conductivity type area.

In the disclosure of the present specification and claims as set out below, the term "effective bonding portion" represents a bonding area of a pad and "noneffective bonding portion" a non-bonding area of the pad.

Upon the application of a negative surge voltage to the resultant diode an electric current flows from the second region of first conductivity type into an area of second conductivity type and from there toward an outside of the pad. This structure obviates the necessity of forming any area of a diode in other than the pad. As a result it is possible to improve an integrated density.

BRIEF DESCRIPTION OF THE DRAWING

FIGS. 4A and 4B are a plan view and cross-sectional view, respectively, showing a semiconductor device whose second region is formed under an effective bonding area.

DETAILED DESCRIPTION OF THE PREFERRED EMBODIMENTS

A semiconductor device according to the present invention will be explained below in more detail.

Figure 1:
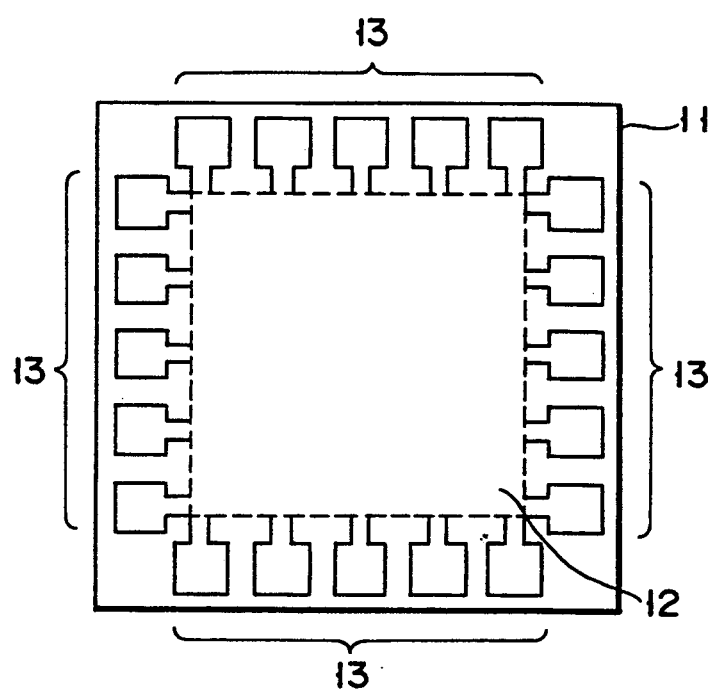
FIG. 1 is a plan view diagrammatically showing a semiconductor chip.
Figure 2A:
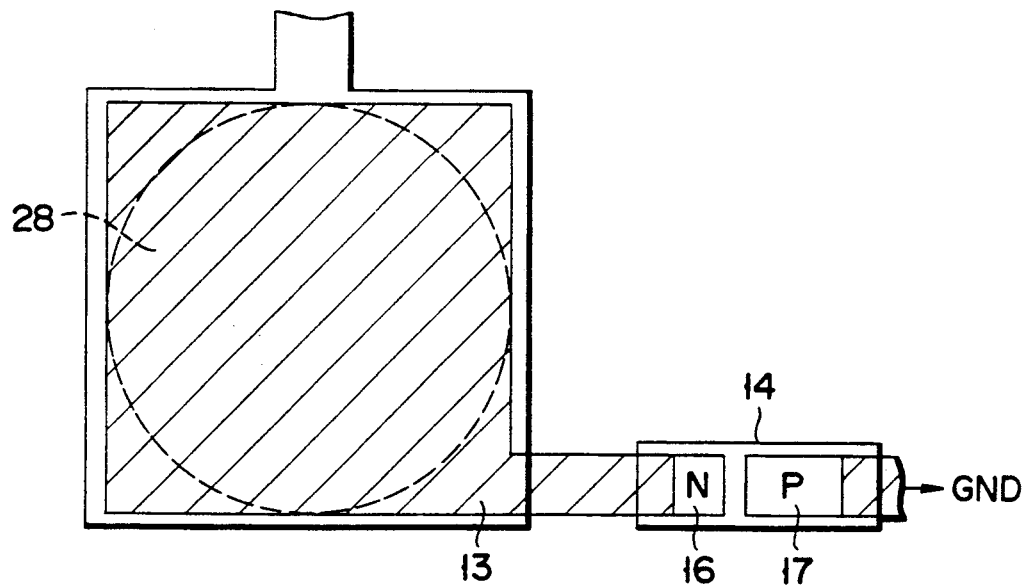
FIGS. 2A and 2B are a plan view and cross-sectional view, respectively showing a conventional semiconductor device.
Figure 2B:
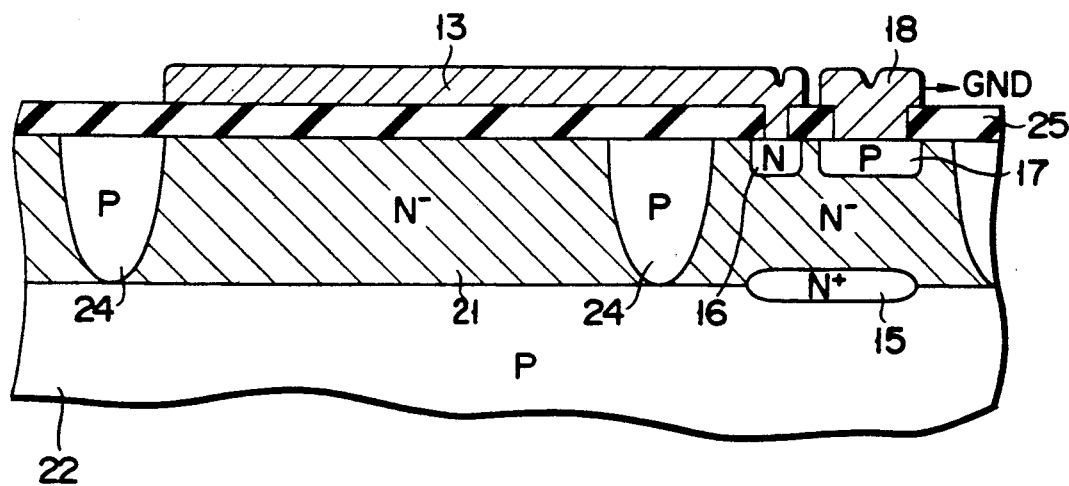
Figure 3A:
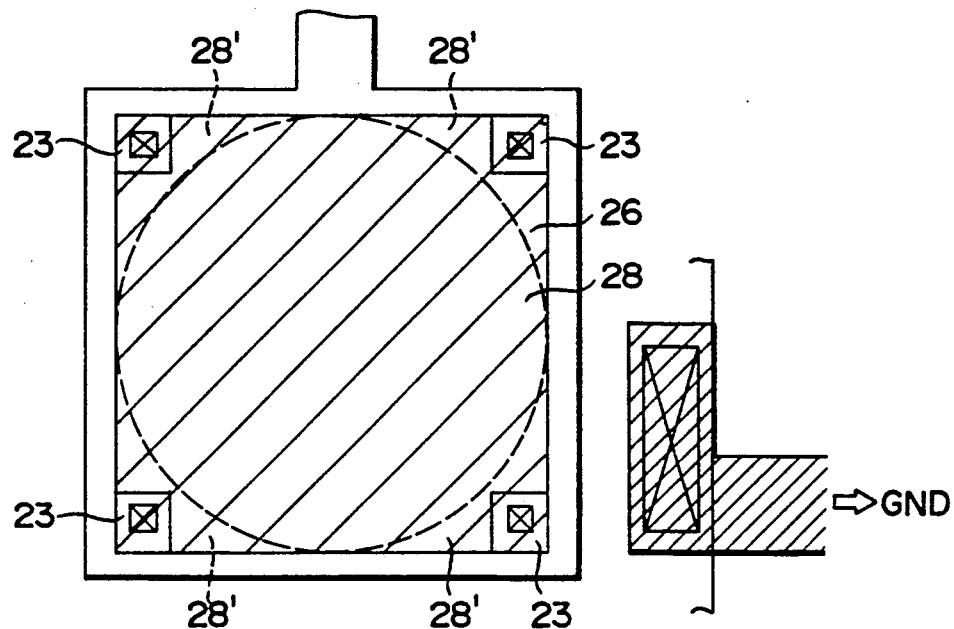
FIGS. 3A and 3B are a plan view and cross-sectional view, respectively, showing a semiconductor device according to one embodiment of the present invention.
Figure 3B:
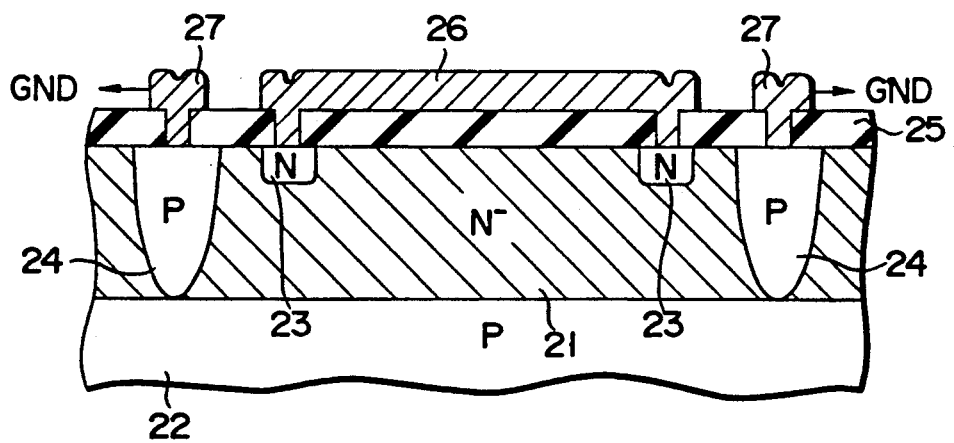

FIGS. 3A and 3B show a semiconductor device according to one embodiment of the present invention. In these Figures, a P type substrate 22, first area 21 of first conductivity (N type) having a low impurity concentration, and P type isolation area 24 are of the same type as those of the conventional semiconductor device. For this reason, the same reference numerals are employed to designate parts or elements corresponding to those shown in FIGS. 3A and 3B. Further explanation of the aforementioned embodiment will, therefore, be omitted. A rectangular pad 26 has a circular effective bonding area 28 as indicated by a broken line in FIG. 3A and noneffective bonding areas 28' formed one at each corner of the rectangular pad. Second region 23 of N conductivity type are formed, by diffusion, beneath the noneffective bonding area, that is, one at each corner of the pad and may be formed at any proper position so long as they serve as the noneffective bonding area 28'. As in this embodiment, it is better to form the second region 23 at each corner of the rectangular pad so as to obtain a desired surge withstand voltage. The surge withstand voltage is not affected even if the effective bonding area 28 is somewhat partly covered by the second region 23. An insulating film 25 of about 5000 Å thick is formed on the major surface of the first area 21. A hole is formed, by photoetching, in that portion of the insulating film 25 over the isolation area 24 and in a contact portion of the insulating layer 25 which is located between the N type second region 23 and the interconnection pad 26. A mask is formed on those portions other than both the insulating layer area corresponding to an electrode 27 to be formed over the isolation area 24 and insulating layer area corresponding to the pad 26. Aluminum is evaporated on the resultant structure to form the aforementioned electrode 27 and pad 26. The semiconductor device is thus manufactured as a protection diode including the second region 23 electrically connected to the pad 26 and isolation layer 24 electrically connected to the electrode 27.

In this way, a PN junction is formed with the N type second region 23 as the cathode and P type isolation layer 24 as the anode. Upon the application of a negative surge voltage of about −250 V to the pad 26, a current flows across the PN junction and, via the isolation layer 24, electrode 27 and wire, into an outside portion of the semiconductor device, such as a ground pad, not shown.

According to the embodiment, it is not necessary to form a negative surge voltage protection diode independently of the island portion of the pad 26. If the chip size is fixed relative to the conventional chip size, an area which is employed as an island area for the conventional negative surge voltage protection diode can effectively be utilized to form another semiconductor element, etc., thus ensuring an increase in design latitude and in integration density. It is also possible to reduce a pad-to-pad distance and hence a chip size.

The inventor has researched the possibility of increasing a surge withstand voltage by, as shown in FIGS. 4A and 4B, forming a second region 23' beneath an effective bonding area 28 of a first area 21 in which case the second region is formed as having a large area. It has been found that, when a bonding wire is bonded by a bonder to a pad 26, the second region 23' which is formed beneath the pad 26 is destroyed due to a bonding impact so that a desired surge characteristic cannot be obtained. This means that, contrary to the inventor's initial intention, not only the surge withstand voltage is not increased but also a desired surge withstand voltage cannot be obtained.

Although, in the aforementioned embodiment, the pad has been explained as being a single-layer structure, it may be formed as a multi-layer structure. The pad is not restricted to the aforementioned rectangular configuration and may have various proper configurations. According to the configuration, the second region can be formed in a proper location beneath the noneffective bonding area.

What is claimed is:

1. A semiconductor device including an element constituting a protection diode for providing protection against a negative surge voltage, said element comprising:

a first region of first conductivity type, formed on a semiconductor substrate, said first region having a major surface area and a given impurity concentration;

an insulating layer formed on said first region of the first conductivity type;

an rectangular interconnection pad formed on the insulating layer and containing a substantially circular effective bonding portion positioned in the center of said pad and a noneffective bonding portion which constitutes the remaining portion of said pad upon formation of the effective bonding portion and consists of the corner regions of said pad;

a second region of said first conductivity type, formed in the major surface area of said first region, overlapping the noneffective bonding portion of said pad, and electrically connected to said pad, said second region having an impurity concentration higher than that of said first region and formed beneath each of the corner regions of said pad;

an area of second conductivity type, formed in said first region; and an electrode formed over said second conductivity type area via the insulating layer and electrically connected to said second conductivity type area.

2. The semiconductor device according to claim 1, wherein said second conductivity type area serves as an isolation layer for electrically isolating said element from an adjacent element.

* * * * *